United States Patent
Takahashi et al.

(10) Patent No.: US 6,738,123 B1
(45) Date of Patent: May 18, 2004

(54) DRIVE CIRCUIT CONNECTION STRUCTURE INCLUDING A SUBSTRATE, CIRCUIT BOARD, AND SEMICONDUCTOR DEVICE, AND DISPLAY APPARATUS INCLUDING THE CONNECTION STRUCTURE

(75) Inventors: Masanori Takahashi, Chigasaki (JP); Riichi Saito, Fujisawa (JP); Toshimichi Ouchi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 08/814,082

(22) Filed: Mar. 10, 1997

(30) Foreign Application Priority Data

Mar. 15, 1996 (JP) .............................. 8/059665

(51) Int. Cl.⁷ ............................................ G02F 1/1345
(52) U.S. Cl. ........................ 349/152; 349/149; 349/150; 349/151
(58) Field of Search ................................ 349/149–152

(56) References Cited

U.S. PATENT DOCUMENTS

| | | | |
|---|---|---|---|
| 4,767,189 A | * 8/1988 | Hayashi et al. | 350/334 |
| 5,161,009 A | * 11/1992 | Tanoi et al. | 359/82 |
| 5,212,576 A | * 5/1993 | Yoshioka | 359/88 |
| 5,270,848 A | 12/1993 | Takabayashi et al. | 359/88 |
| 5,311,341 A | * 5/1994 | Hirai | 359/88 |
| 5,375,003 A | * 12/1994 | Hirai | 359/88 |
| 5,467,210 A | * 11/1995 | Kishigami | 349/150 |
| 5,517,208 A | 5/1996 | Mori et al. | 345/87 |
| 5,528,403 A | * 6/1996 | Kawaguchi et al. | 359/88 |
| 5,583,681 A | 12/1996 | Shioya et al. | 349/60 |
| 5,726,726 A | * 3/1998 | Nakanishi | 349/149 |
| 6,025,893 A | * 2/2000 | Kadowaki et al. | 349/58 |
| 6,061,246 A | * 5/2000 | Oh et al. | 361/750 |

FOREIGN PATENT DOCUMENTS

JP 7-321152 12/1995

OTHER PUBLICATIONS

Patent Abstracts Of Japan, vol. 096, No. 004, Apr. 30, 1996 & JP 07 321152 A (Citizen Watch Co LTD), Dec. 8, 1995, * abstract *.
Patent Abstracts Of Japan, vol. 018, No. 612 (P–1829), Nov. 21, 1994 & JP 06 230405 A (NEC Corp), Aug. 19, 1994, * abstract *.
Patent Abstracts Of Japan, vol. 095, No. 002, Mar. 31, 1995 & JP 06 313893 A (Kyocera Corp), Nov. 8, 1994, * abstract *.
Patent Abstracts Of Japan, vol. 017, NO. 060 (P–1482), Feb. 5, 1993 & JP 04 269722 A (Rohm Co Ltd), Sep. 25, 1992, * abstract *.

* cited by examiner

*Primary Examiner*—Julie-Huyen L. Ngo
(74) *Attorney, Agent, or Firm*—Fitzpatrick, Cella, Harper & Scinto

(57) ABSTRACT

A circuit connection structure including a substrate, a circuit board, a semiconductor, and a flexible wiring member. The substrate has a part of a display panel and an electrode terminal formed thereon. The circuit board is disposed with a space between it and the substrate and has an electrode terminal. The semiconductor device bridges the space between the substrate and the circuit board and has a first electrode and a second electrode and includes a driver IC. The flexible wiring member has a conductor, of which, opposite ends are connected to the second electrode and the electrode terminal of the circuit board, respectively. The driver IC is connected to the substrate by connecting the first electrode to the electrode terminal on the substrate. By connecting the driver IC to the substrate in this manner, it becomes possible to obviate a conventional thermal problem of positional deviation.

7 Claims, 7 Drawing Sheets

DRIVE CIRCUIT CONNECTION STRUCTURE INCLUDING A SUBSTRATE, CIRCUIT BOARD, AND SEMICONDUCTOR DEVICE, AND DISPLAY APPARATUS INCLUDING THE CONNECTION STRUCTURE

FIELD OF THE INVENTION AND RELATED ART

The present invention relates to a drive circuit connection structure suitable for use in a display apparatus, and particularly a connection structure including a drive semiconductor device connected to a periphery of a transparent substrate of a display panel constituting such a display apparatus and a circuit board connected to the semiconductor device for supplying input signals and a power to the semiconductor device.

Hitherto, there have been known display apparatus including flat display devices having display electrodes arranged in the form of, e.g., a matrix, such as EL display panels and liquid crystal display panels of the simple matrix-type and the active matrix-type. Such display apparatus have conventionally included a circuit connection structure including a transparent substrate, such as a glass substrate or a plastic substrate, provided with display electrodes arranged in the form of, e.g., a matrix; a flexible tape carrier package (TCP) loaded with a driver IC by the TAB (tape-automated bonding) method; and a print circuit board (PCB, hereinafter sometimes called "PCB board"), connected in this order.

FIG. 12 and FIG. 13 (a view showing a 13-13 section in FIG. 12) illustrate an example of such a drive circuit connection structure for a flat display panel. Referring to these figures, the connection structure includes TCPs $4ap$ and $8p$ loaded with driver ICs (as drive semiconductor circuits) $5p$ and $9p$ and copper foil patterns $32$ (as output electrodes), glass substrates $1ap$ and $1bp$ for a liquid crystal panel $1$ having electrode terminals $12p$ extended to peripheries thereof, and ACFs (anisotropic conductive films or anisotropic conductive adhesive) $31$ for heat-bonding the copper foil patterns $32$ on the TCPs with the electrode terminals $12p$ on the glass substrates. Further, PCB boards $3p$ for supplying a power and control signals to the driver ICs $5p$ and $9p$ are connected with copper foil patterns $17$ (as input electrodes) of the TCPs $4ap$ with solder $20p$.

The input electrodes and the output electrodes of each driver IC $5p$ are connected to the copper foil electrodes $17$ and $32$ on the input side and output side TCPs $4a$, respective via gold bumps $15p$. The connections of each driver IC $5p$ are sealed with a resinous sealing agent $16p$. In such a display panel connection structure for a display apparatus as shown in FIGS. 12 and 13, as the display panel (particularly a liquid crystal panel) is provided with a larger number of display electrodes at a higher density, the connection pitch for connection between the output electrodes of the TCPs and the electrode terminals on the transparent substrates are decreased down to a required pitch of 50 μm or smaller. However, according to a method for connecting TCP with a substrate as explained with reference to FIGS. 12 and 13, a very sophisticated and accurate bonding technique is required for ensuring such a minute connection pitch because of a limitation in size accuracy of TCPs and a deviation due to thermal expansion during connection by heat bonding of TCPS. Therefore, a connection structure as shown in FIG. 14 including bonding of driver ICs $5$ to a substrate $1bp$ by a face-down mode has been proposed or ensuring such a minute connection pitch.

More specifically, referring to FIG. 14, the connection structure includes a connection by the face-down bonding mode of driver ICs $5$ with electrode terminals extended to peripheries of a pair of glass substrates $1ap$ and $1bp$ of a display panel and with input electrodes (not shown) formed on the glass substrates $1ap$ and $1bp$. The connection structure further includes flat cables $7a$, $7b$ and $7c$ for supplying a drive power and control signals from an external control circuit.

However, in case where such a connection structure as shown in FIG. 14 is adopted in a display panel of a larger size, particularly a liquid crystal display panel of an enlarged size as desired, in recent years, the substrates $1ap$ and $1bp$ retain only narrow non-opposing peripheral areas while the input electrodes are increased in length, so that the input electrodes are caused to have a higher impedance, thus being liable to cause a delay in transmission of drive waveforms to the display or pixel electrodes leading to pixels.

In order to obviate the difficulty, it may be conceived of lowering the impedance of the input electrodes by forming the electrodes in a larger thickness, but the realization thereof is difficult in view of the limitations from the production process and size. Further, the increased impedance of the input electrodes is liable to cause a mal-function of data transfer during transmission of image data for a liquid crystal display panel of a higher definition to driver ICs.

SUMMARY OF THE INVENTION

A generic of the present invention is to solve the above-mentioned problems of the prior art.

A more specific object of the present invention is to provide a circuit connection structure capable of providing a lower input electrode impedance while ensuring a minute connection pitch.

Another object of the present invention is to provide a display apparatus including such a circuit connection structure.

According to the present invention, there is provided a circuit connection structure, comprising: a first substrate having electrode terminals formed thereon, a semiconductor device having first electrodes and second electrodes with the first electrodes connected to the electrode terminals of the first substrate, a flexible wiring member having thereon a pattern of conductors each extending from a first end to a second end on the flexible wiring member with the first ends of the conductors connected to the second electrodes of the semiconductor device, and a circuit board having thereon electrode terminals connected to the second ends of the conductors on the flexible wiring member.

It is preferred that the first and second electrodes of the semiconductor device are used as output electrodes and input electrodes, respectively, of the semiconductor device, so as to receive input data from the circuit board and supply output signals to the first substrate, thereby driving an electronic device including the first substrate.

The flexible wiring member may alternatively be constituted by a plurality of conductor wires each extending from a first end to a second end and not carried on a carrier film.

According to another aspect of the present invention, there is provided a display apparatus, comprising:

a display panel comprising at least one substrate having thereon pixel electrodes extending to form electrode terminals electrodes on a peripheral side of the substrate, a semiconductor device having input electrodes, and output electrodes for supplying drive waveforms to the pixel electrodes of the display panel, and a circuit board having electrode terminals for supplying an electric power and control signals to the semiconductor device; wherein the electrode terminals on said at least one substrate of the display panel are connected to the output electrodes of the semiconductor device, and the semiconductor device is connected to the circuit board via a flexible wiring member having thereon a pattern of conductors each extending from a first end to a second end so that the input electrodes of the semiconductor device are connected to the first ends of the conductors on the flexible wiring member, and the second ends of the conductors of the flexible wiring member are connected to the electrode terminals of the circuit board.

According to the circuit connection structure of the present invention, the first electrodes on one side of the semiconductor device may be connected to the electrode terminals on the first substrate which may carry pixel electrodes thereon via, e.g., an anisotropic conductive adhesive (ACF), etc., and without via a flexible wiring member according to the TAB method, thereby ensuring a minute connection pitch. On the other hand, the second electrodes on the other side of the semiconductor device are connected via conductors of the flexible wiring member to the electrode terminals of the circuit board. Particularly when the first and second electrodes of the semiconductor device are used as the output and input electrodes, respectively, the semiconductor device can be supplied with an electric power and control signals at a low impedance from the circuit board through the flexible wiring member and the second electrodes, and can supply output signals through the first electrodes at a minute arrangement pitch suitable for a high-definition output.

Particularly, if the circuit connection structure is included in a driver IC connection structure for a display apparatus including the first substrate as a substrate carrying pixel electrodes of a display panel and the circuit board for supplying an electric power and control signals to the driver IC, the semiconductor device can be supplied with input data at a low impedance and without mal-function and can supply drive signals to the display panel through the first electrodes arranged at a minute connection pitch suitable for a higher definition display.

These and other objects, features and advantages of the present invention will become more apparent upon a consideration of the following description of the preferred embodiments of the present invention taken in conjunction with the accompanying drawings, wherein like parts are denoted by like reference numerals.

DESCRIPTION OF THE PREFERRED EMBODIMENTS

Figure 1:
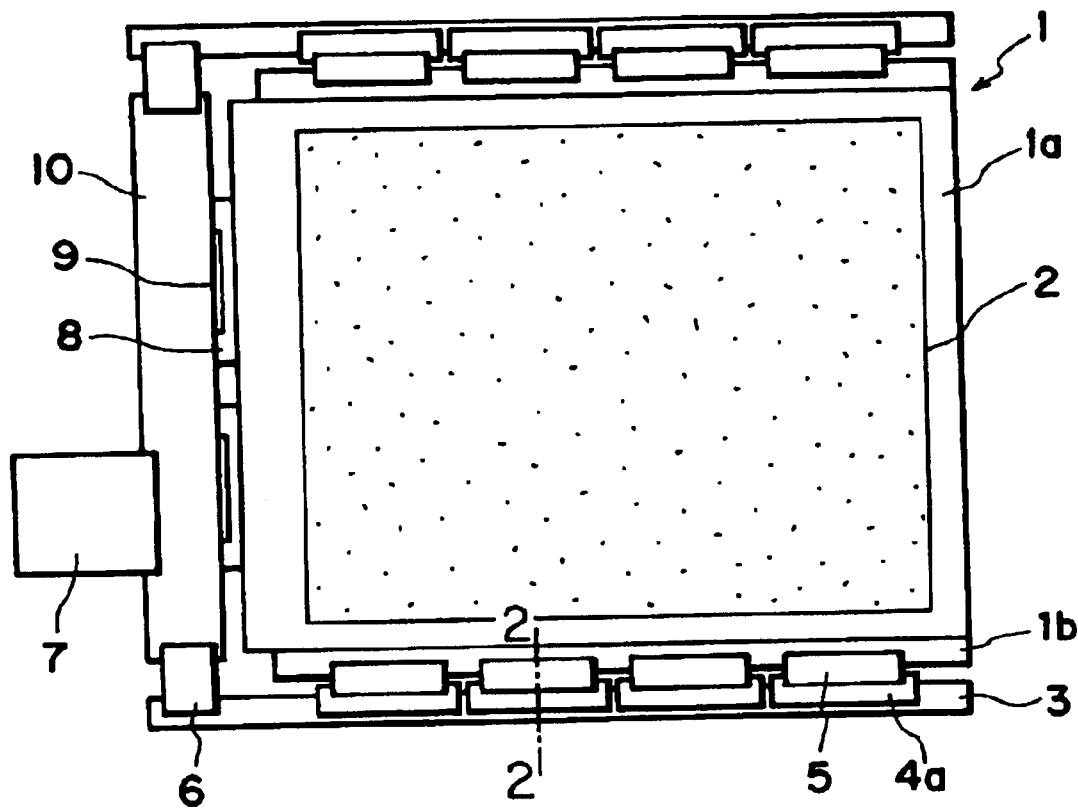
FIG. 1 is a plan view of a display apparatus including a drive circuit connection structure according to a first embodiment of the invention.
Figure 2:
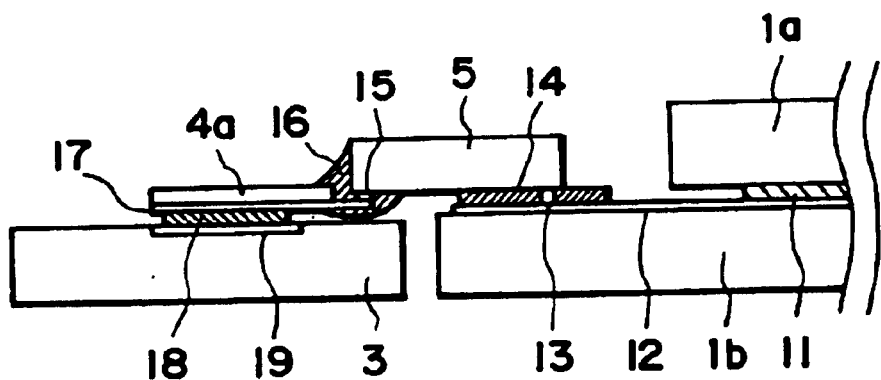
FIG. 2 is a partial sectional view taken along a line 2—2 in FIG. 1.

FIG. 1 is a plan view of a liquid crystal display apparatus, as an embodiment of display apparatus, including a drive circuit connection structure according to a first embodiment of the present invention, and FIG. 2 is a sectional view taken along a line 2—2 in FIG. 1. In FIGS. 1 and 2, reference numerals identical to those used in FIGS. 12–13 denote identical or like parts as in FIGS. 12–13.

Referring to FIGS. 1 and 2, a liquid crystal display apparatus 1 includes a pair of transparent substrates 1a and 1b of, e.g., glass, a polarizer 2 (which sandwiches the liquid crystal panel 1 together with a polarizer (not shown) on an opposite side), circuit boards 3 and 10 (of, e.g., a multi-layered glass epoxy PCB board) for supplying a drive power and control signals to driver ICs 5 and 9, flexible wiring members 4a and 8, flat cables 6 for supplying data signals to the circuit boards 3, and a flat cable 7 for supplying a drive power and control signals from an external control circuit (not shown). Referring to FIG. 2, a liquid crystal 11 (which is a ferroelectric liquid crystal in this embodiment but can also be a nematic liquid crystal, etc.) is disposed between the substrates 1a and 1b.

The substrates 1a and 1b are provided with electrodes for applying a drive voltage to the liquid crystal 1, and at least one thereof is provided with display electrodes or pixel electrodes leading to or defining the pixels and supplying display data signals to the respective pixels. The pixel electrodes extend to non-opposing peripheries of the substrates 1a and/or the substrate 1b to form electrode terminals thereat. In this embodiment, both substrates 1a and 1b are provided with pixel electrodes so as to form a simple matrix electrode structure suitable for driving the ferroelectric liquid crystal including, e.g., data electrodes on the substrate 1a and scanning electrodes on the substrate 1b, and the pixel electrodes are extended to non-opposing peripheries of both substrates 1a and 1b to form electrode terminals 12 thereat.

Each driver IC 5 is connected to electrode terminals 12 formed on the glass substrate 1b and extended to a peripheral side of the glass substrate 1b, and the input electrodes of the driver IC 5 are provided in advance with gold bumps 15 to which first ends of conductors on a flexible wiring member 4a are connected by the TAB method, and second (the other) ends of conductors on the flexible wiring member 4a are connected to electrode terminals of the circuit board 3.

Figure 3A:
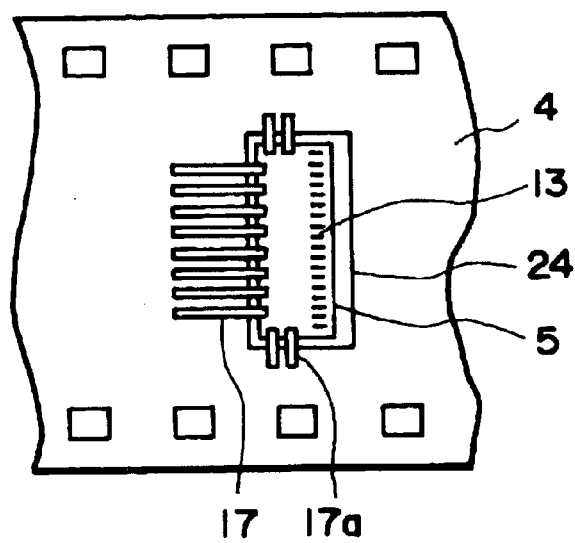
FIGS. 3A–3C are partial plan views for illustrating steps of bonding a driver IC onto a flexible wiring member in the display apparatus of FIGS. 1 and 2.
Figure 3B:
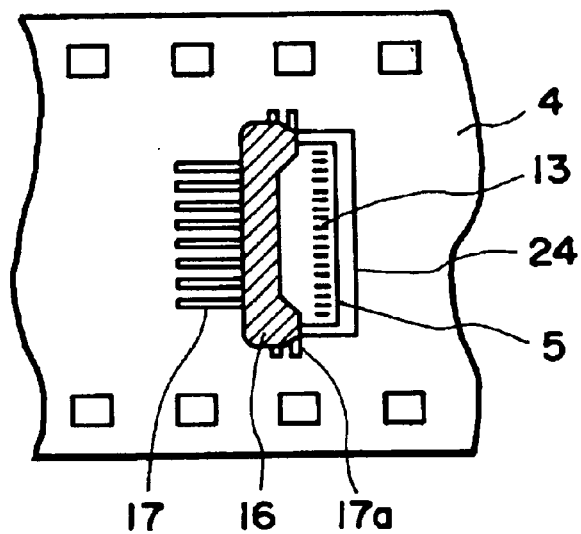
Figure 3C:
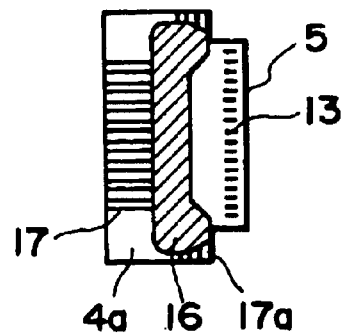

At the time of assembling the display apparatus, each driver IC 5 is connected to the glass substrate 1b by first positionally aligning projection electrodes 13 (of, e.g., gold bumps formed on the output electrodes) of the device IC 5 with the electrode terminals 12 on the glass substrate 1b and connecting the projection electrodes 13 and the electrode terminals 12 via an anisotropic conductive adhesive 14 under application of heat and pressure. The projection electrodes 13 (of e.g., gold bumps) may be formed at a minute connection of preferably 50 μm or smaller as shown in FIGS. 3A–3C described hereinafter.

By connecting the driver IC 5 provided with the projection electrodes 13 to the electrode terminals 12 of the glass substrate 1b without via a flexible wiring member 4a, it becomes possible to obviate a thermal positional deviation due to heat during the heat-pressure bonding, thus ensuring a prescribed connection pitch.

On the other hand, the second ends of conductors 17 (patterned copper foil of, e.g., 15–35 μm in thickness) on the flexible wiring member 4a which have been connected in advance at their first ends to the input electrodes of the driver IC are connected to connection electrodes (electrode terminals) 19 of the circuit board 3 by heat-pressure bonding via an anisotropic conductive adhesive 18.

The copper foil electrodes 17 of the flexible wiring member 4a and the anisotropic conductive adhesive 18 respectively have prescribed thicknesses so that the conductors between the driver IC 5 and the circuit board 3 may have a lower impedance.

By supplying input signals to the driver IC 5 through low-impedance conductors 17 in the above-described manner, it becomes possible to obviate a delay in transmission of drive waveforms and a mal-function during data transmission. Incidentally, the anisotropic conductive adhesive 14 for connecting the electrode terminals 12 on the glass substrate 1b and the output electrodes of the driver IC 5, and the anisotropic conductive adhesive 18 for connecting the copper foil electrodes 17 on the flexible wiring member 4a and the connection electrodes 19 of the circuit board 3, may respectively be composed by selecting electroconductive particles and an adhesive suitable therefor and need not be identical to each other.

More specifically, in the above-described embodiment, a commercially available anisotropic conductive film (ACF) may be used as the anisotropic conductive adhesive 18. Generally, however, the anisotropic conductive adhesive 18 may comprise a liquid insulating adhesive of heat-curable type or UV-curable type containing electroconductive particles dispersed therein. Alternatively it is also possible to use such a liquid insulating adhesive together with gold bumps formed on the electrode terminals. Examples of the electroconductive particles may include Ni-plated or Ni—Au-plated resin particles of 2–5 μm in diameter for output electrode connection and Ni particles or Au-plated Ni particles of 5–10 μm in diameter for input electrode connection.

Figure 12:
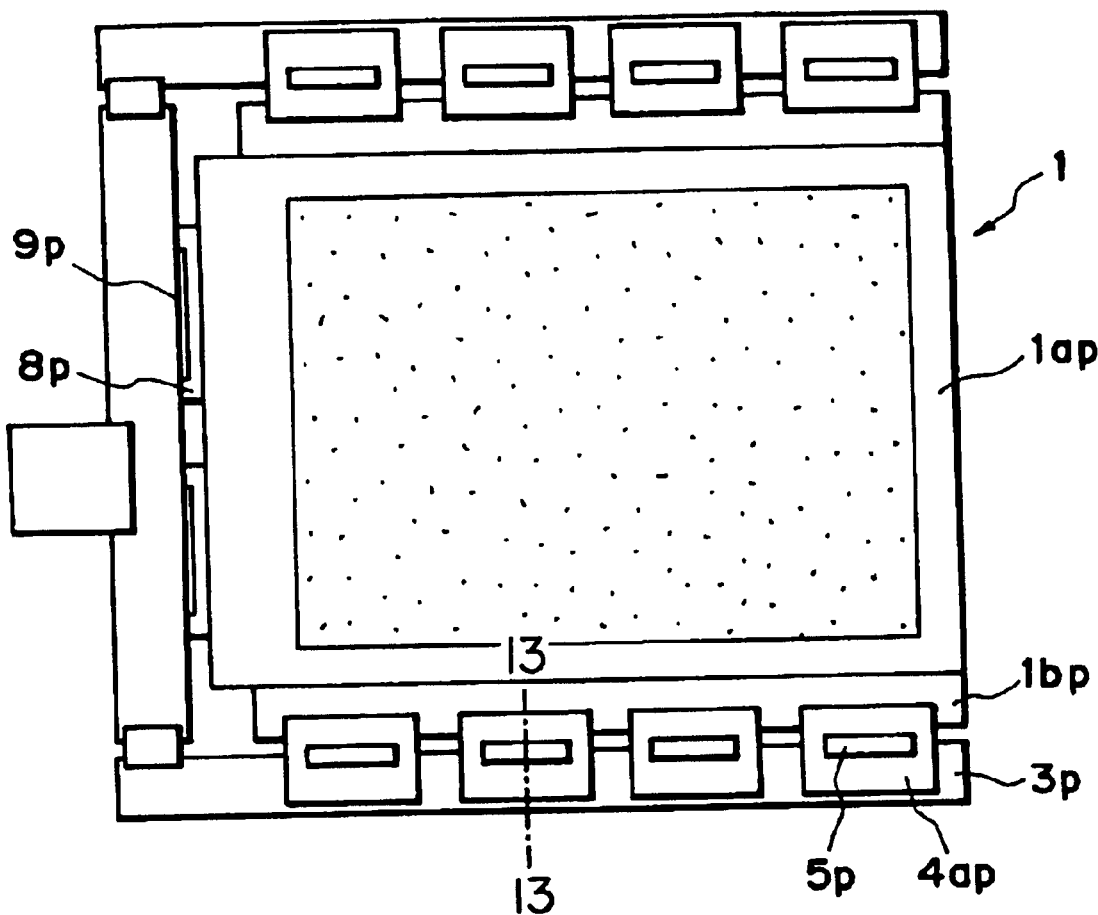
FIG. 12 is a plan view of a liquid crystal display apparatus including a drive circuit connection structure.
Figure 13:
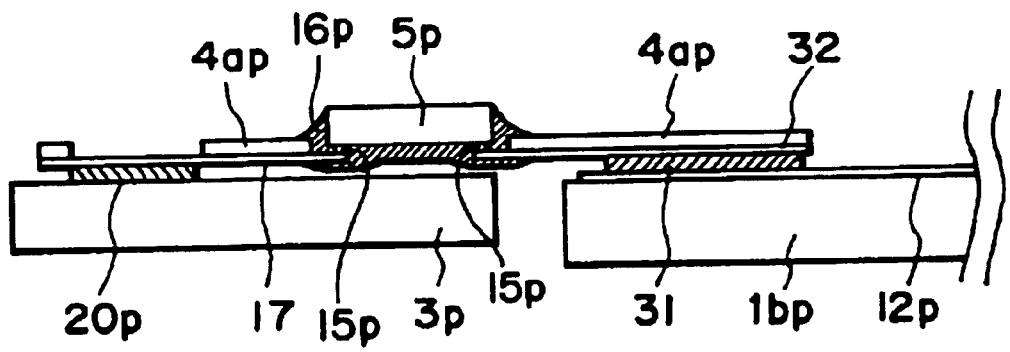
FIG. 13 is a partial sectional view taken along a line 13—13 in FIG. 12.
Figure 14:
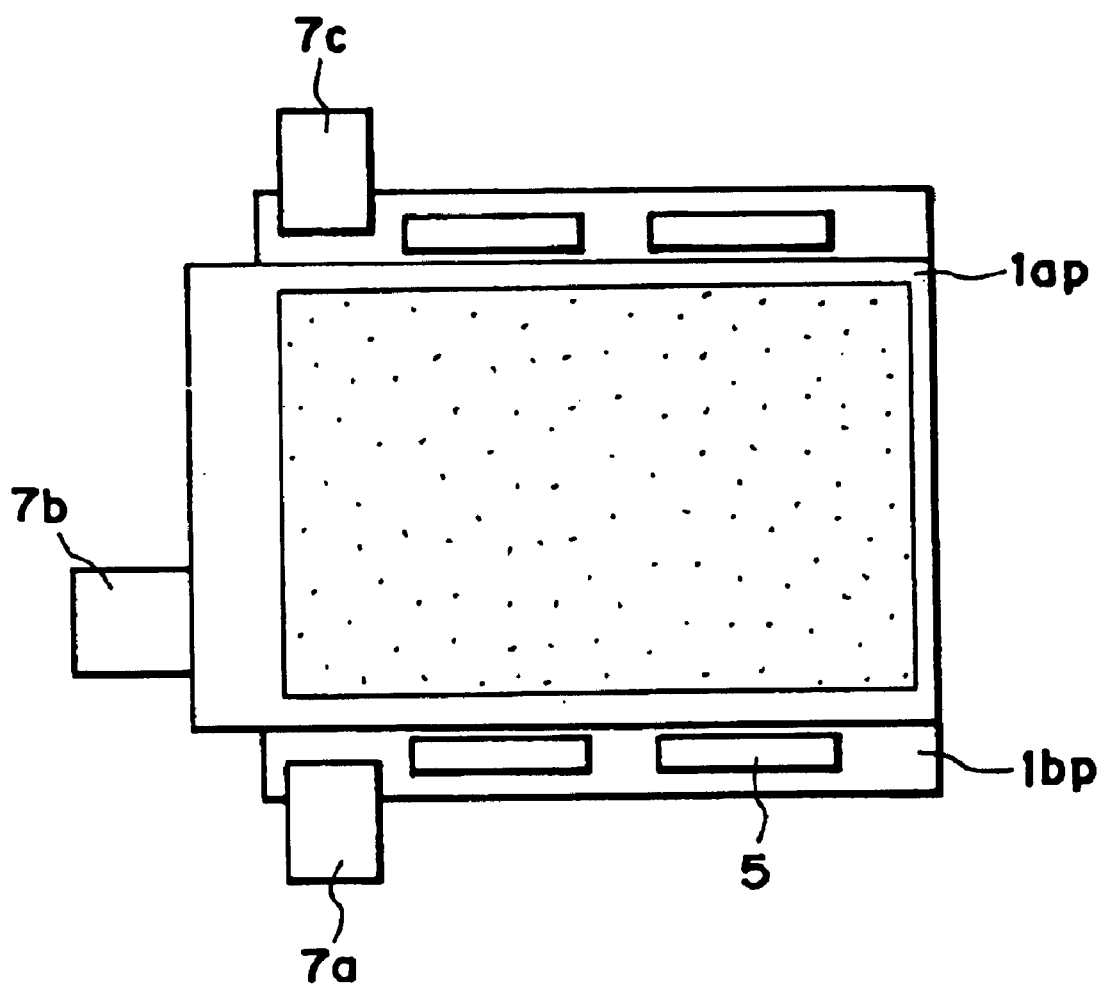
FIG. 14 is a partial sectional view of a liquid crystal display apparatus including another drive circuit connection structure.

In the embodiment shown in FIG. 1, the circuit connection structure characteristic to the present invention as described above is applied to peripheral sides of only one substrate 1b of the display panel 1, and at a peripheral side of the other substrate 1a, drivers IC 9 are connected via a TCP with respect to both input side and output side thereof similarly as in the case of FIG. 12. However, it is also possible to adopt the circuit connection structure having a sectional structure as shown in FIG. 2 for bonding the driver ICs 9 to the substrate 1a similarly as the driver ICs 5 connected to the substrate 1b.

Then, a flexible wiring member 4a may be connected to a driver IC 5 by the TAB method, for example, in the following manner.

First of all, as shown in FIG. 3A, an aperture 24 is formed in a film carrier 4 of, e.g., polyimide or polyethylene terephthalate of ca. 25–125 μm in thickness, and tin-plated copper foil conductors 17 and 17a are formed thereon. Then, gold bumps 15 (FIG. 2) formed on input electrodes of the driver IC 5 are positionally aligned with the copper foil patterns 17 and 17a and subjected to inner lead bonding by means of a bonding tool. Instead of the above-mentioned tin plating of, e.g., 0.2–0.6 μm in thickness, it is also possible to use 0.2–10 μm-thick solder, 0.2–0.9 μm-thick gold or 0.2–10 μm-thick Ni for coating the copper foil conductors 17 and 17a.

The copper foil patterns 17a are used as support patterns for fixing the driver IC and connected to dummy gold bumps (not shown) formed on the driver IC 5. However, it is also possible to dispose additional input electrodes there that can be connected to and receive signals from the flexible wiring member 4a.

Figure 4:
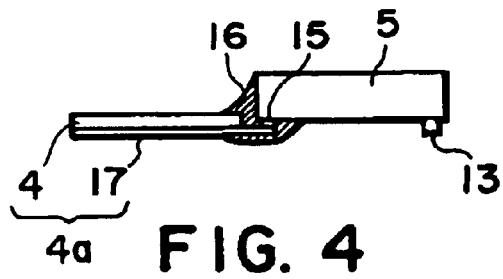
FIG. 4 is a side sectional view of a resultant connection structure including the driver IC and the flexible wiring member connected to each other after the steps of FIGS. 3A–3C.

Then, as shown in FIG. 3B, only the input side of the driver IC 5 is sealed with a resinous sealing agent 16. Then, an unnecessary portion of the flexible wiring member 4a is removed by punching to leave a connection structure having a planar structure as shown in FIG. 3C and a sectional structure as shown in FIG. 4.

In this instance, the gold bumps (projecting electrodes) 13 on the output electrodes of the driver IC may preferably be flattened by the bonding tool at the time of the inner lead bonding or by pressing with another flattening pressure member so as to provide a uniform projection height, in order to provide a reliable bonding between the electrode terminals 12 and the output electrodes 5 of the driver IC 4 with an anisotropic conductive adhesive 14.

In a preferred example of circuit connection structure adopted for constituting a liquid crystal apparatus, each driver IC may have ca. 30–60 input electrodes (second electrodes) arranged at a pitch of ca. 100–500 μm in both cases of constituting a data signal side IC and a scanning signal side IC. Further, each driver IC may have ca. 200–500 output electrodes (first electrodes) arranged at a pitch of ca. 20–60 μm when used as a data signal side IC and at a pitch of ca. 100–300 μm when used as a scanning signal side IC. The circuit connection structure according to the present invention may be adopted for both data signal side ICs and scanning signal side IC but may preferably be used at least for data signal side ICs requiring output electrodes (first electrodes) arranged at a higher density in the embodiment of FIG. 1.

Further to say, in a drive system using a liquid crystal showing bistability, such as a ferroelectric liquid crystal, an anti-ferroelectric liquid crystal or a BTN-mode liquid crystal driven in a binary mode, an area1 gradational display mode according to a pixel division may be used, thus requiring an increased number of electrodes corresponding to the pixel division and arrangement of driver ICs and output electrodes at a higher density. In such cases, the circuit connection structure according to the present invention may preferably be used not only for data signal side ICs but also for scanning signal side ICs.

Figure 5:
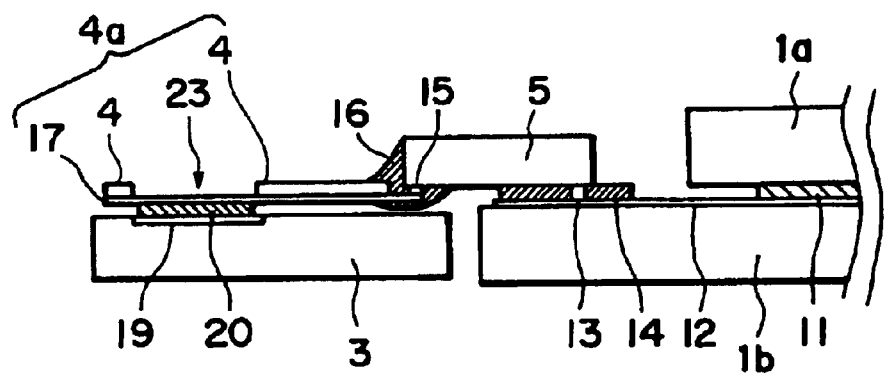
FIGS. 5–6 and 8–10 are partial sectional views of display apparatus including drive circuit connection structures according to second to sixth embodiments, respectively, of the invention.

FIG. 5 is a partial sectional view of a liquid crystal display apparatus including a drive circuit connection structure according to a second embodiment of the present invention, wherein copper foil patterns 17 and connection electrodes 19 on a circuit board 3 are connected with a solder 20. Other members denoted by identical numerals as in FIG. 2 represent identical or like members as in FIG. 2, and 23 represents an aperture formed in a polyimide film carrier 4 at the soldering portion.

Figure 6:
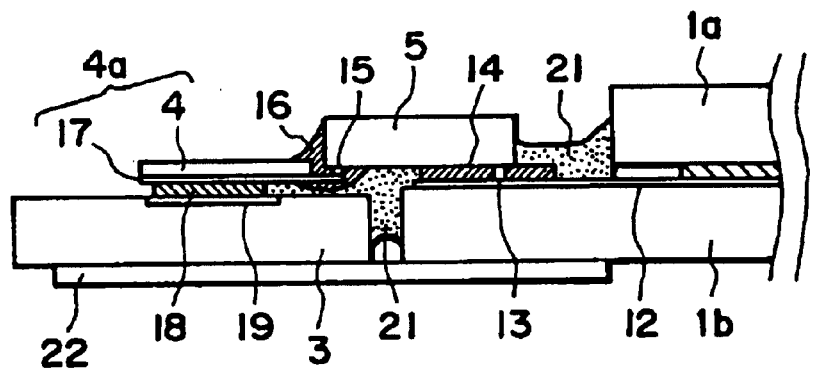

FIG. 6 is a partial sectional view of a liquid crystal display apparatus including a drive circuit connection structure according to a third embodiment of the present invention, wherein the connection structure is protected by a resinous sealing agent 21 and reinforced by a reinforcing plate 22. In this instance, after applying the resinous sealing agent 21, the reinforcing plate may be bonded to the glass substrate 1a and the circuit board 3 from the back sides, so as to prevent the breakage of the electrical connection even when a stress is applied to the circuit board 3. It is particularly preferred to adopt the reinforcement structure with the reinforcing plate 22 in case where one side of electrodes (output electrodes in this embodiment) of the driver IC 5 are bonded to electrode terminals on the substrate 1b without using a flexible wiring member as in this embodiment.

Figure 7:
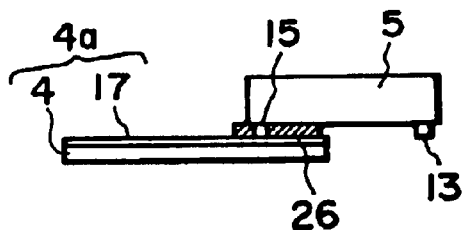
FIG. 7 is a sectional view of a partial connection structure incorporated in the embodiment of FIG. 8.

FIG. 7 is a sectional view a drive circuit connection structure according to a fourth embodiment of the present invention, wherein a driver IC 5 is connected to a flexible wiring member 4a with an anisotropic conductive adhesive 26. The connection structure may be incorporated in a liquid crystal display apparatus having a sectional structure as shown in FIG. 8, wherein the projecting electrodes 13 of the driver IC 5 are thermally pressure-bonded to electrode terminals 12 on the glass substrate 1b via an anisotropic conductive adhesive 14, and conductors 17 on the flexible wiring member 4a are thermally pressure-bonded to connection electrodes 19 on a circuit board 3.

Figure 8:
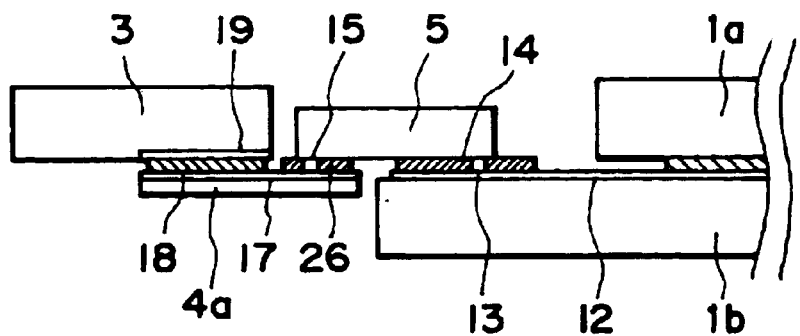

In FIG. 8, the conductors (copper foil patterns) 17 are disposed on an upper surface of the flexible wiring member 4a, and correspondingly the circuit board 3 is disposed above the flexible wiring member 4a (on the side having the conductors 17).

Figure 9:
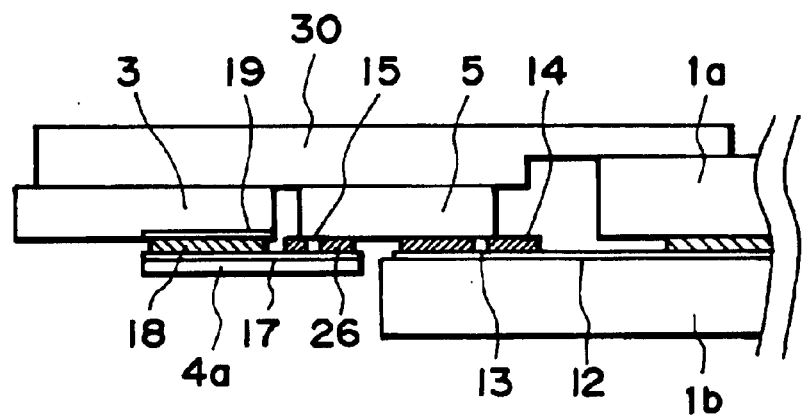

FIG. 9 is a partial sectional view of a liquid crystal display apparatus including a drive circuit connection structure according to a fifth embodiment of the present invention, wherein a reinforcing plate 30 is disposed along and bonded to the circuit board 3, the driver IC 5 and another substrate 1a in a structure similar to the one shown in FIG. 8. The resultant structure is resistant to a stress applied to the circuit board 3, etc., thus being able to avoid a breakage of the electrical connection similarly as in the embodiment of FIG. 6.

Figure 10:
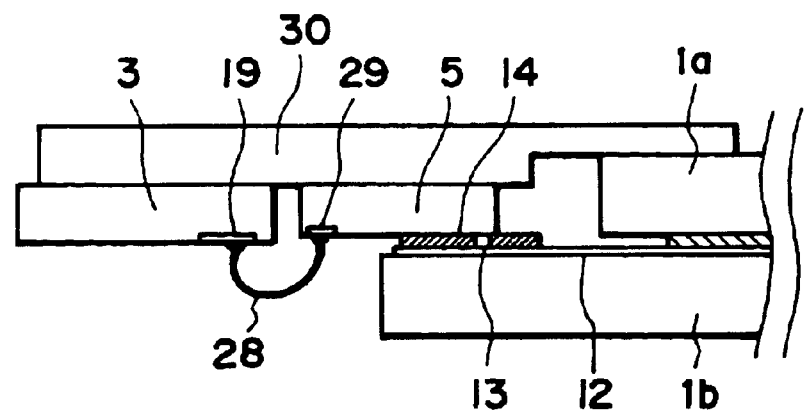

FIG. 10 is a partial sectional view of a liquid crystal display apparatus including a drive circuit connection structure according to a sixth embodiment of the present invention, wherein electrode terminals 12 on the glass substrate 1b and the projecting electrodes 13 on the driver IC 5 are thermally pressure-bonded to each other via an anisotropic conductive adhesive 14 after positional alignment therebetween, input electrodes 29 of the driver IC 5 are electrically connected to connection electrodes on the circuit board 3 with conductive wires 28, and a reinforcing plate 30 is provided to fix the glass substrate 1a, the driver IC and the circuit board 3 by bonding similarly as in FIG. 9.

Finally, an organization of a liquid crystal display apparatus including a liquid crystal display panel as described above together with a control system thereof will be briefly described with reference to a block diagram of such a liquid crystal display apparatus, for example, shown in FIG. 11.

Figure 11:
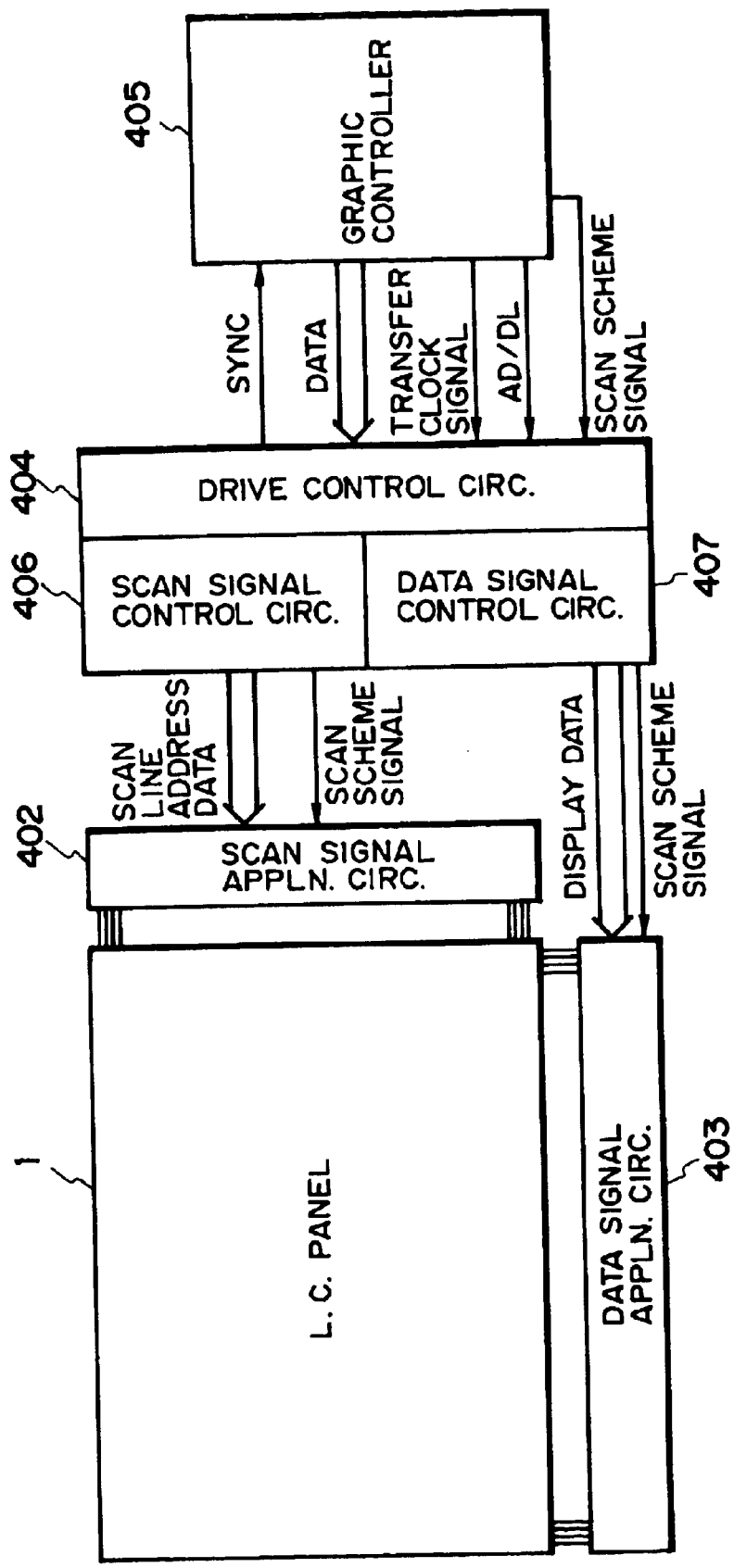
FIG. 11 is a block diagram of a liquid crystal display apparatus.

Referring to FIG. 11, a liquid crystal display apparatus, such as a color display apparatus, may include a liquid crystal panel 1 as described above according to the present invention, to which are connected a scanning signal application circuit 402 and a data signal application circuit 403 which are sequentially connected to a canning signal control circuit 406 and a data signal control circuit 407, a drive control circuit 404 and then to a graphic controller 405. From the graphic controller 405, video data and a scanning scheme signal are supplied to the scanning signal control circuit 406 and the data signal control circuit 407 via the drive control circuit 404.

The video data is converted into scanning line address data and display data by the scanning signal control circuit 406 and the data signal control circuit 407, and the scanning scheme signal is supplied as it is to the data signal application circuit 402 and the data signal application circuit 403.

The scanning signal application circuit 402 applies a scanning signal determined by the scanning scheme signal to the scanning electrodes in a sequence determined by the scanning line address data, and the data signal application circuit 403 applies data signals having waveforms determined by a combination of the display data determining white or black display states and the scanning scheme signal to the respective data electrodes. These data signals and scanning signals are supplied via flat cables 6 and 7 to circuit board 3 and 10, whereby a picture display may be performed on the liquid crystal panel 1 as shown in FIG. 1.

In the above, the circuit connection structure according to the present invention has been described principally as one suitably used in a liquid crystal display apparatus but may also be suitably incorporated in other display apparatus inclusive of those including self-light emission-type flat display panels as represented by an EL-display panel and a plasma display panel.

As described above, according to the present invention, by connecting electrode terminals disposed on a peripheral side of a display panel to first electrodes on one side of a drive semiconductor device with, e.g., an anisotropic conductive adhesive, the electrode terminals and the drive semiconductor device may be connected without a flexible wiring member, thus ensuring a small connection pitch.

On the other hand, second electrodes on the other side of the drive semiconductor device may be connected to a flexible wiring member, and the flexible wiring member is connected to a circuit board on a supply side with a solder or an anisotropic conductive adhesive, the power and signal can be supplied to the driver semiconductor device at a low impedance. As a result, even if a display panel, such as a liquid crystal display panel, is enlarged in area1 size and driven at a higher speed, drive waveforms can be transmitted to pixel electrodes of the display panel without transmission delay or deformation of drive waveforms. Further, in case of supplying picture data for a display panel of a higher definition it is possible to obviate a mal-function during data transmission.

What is claimed is:

1. A circuit connection structure, comprising:

a substrate forming a part of a display panel and having an electrode terminal formed thereon;

a circuit board disposed with a space between said circuit board and said substrate and having thereon an electrode terminal;

a semiconductor device comprising a driver IC, said semiconductor device having a first electrode and a second electrode; and a flexible wiring member having a conductor, wherein opposite ends of the conductor of said flexible wiring member are connected to the second electrode and the electrode terminal of said circuit board, respectively, and wherein said semiconductor device bridges the space between the substrate and the circuit board such that the driver IC is located over the space and the first electrode of the semiconductor device is connected to the electrode terminal on the substrate with an anisotropic conductive adhesive.

2. A connection structure according to claim 1, wherein in said semiconductor device the first and second electrodes are structured to act as output and input electrodes, respectively, thereof so as to receive input data from the circuit board and supply output signals to the substrate, thereby driving an electronic device.

3. A connection structure according to claim 1, wherein the second electrode of the semiconductor device is connected to the conductor on the flexible wiring member by a tape-automated bonding method.

4. A connection structure according to claim 1, wherein the connection between the second electrode of the semiconductor device and the conductor ends of the conductors conductor on the flexible wiring member is sealed with a resin.

5. A display apparatus, comprising:

a display panel comprising at least one substrate, said at least one substrate having thereon a pixel electrode extending to form an electrode terminal on a peripheral side of said at least one substrate;

a semiconductor device having an input electrode, and an output electrode for supplying drive waveforms to the pixel electrode of the display panel; and a circuit board disposed with a space between said circuit board and said at least one substrate of the display panel and having an electrode terminal for supplying an electric power and control signals to the semiconductor device, wherein the semiconductor device is connected to the circuit board via a flexible wiring member disposed in a lateral position with respect to said at least one substrate, said flexible wiring member having thereon a conductor extending from a first conductor end to a second conductor end so that the input electrode of the semiconductor device is connected to the first conductor end, and the second conductor end is connected to the electrode terminal of the circuit board, and wherein said semiconductor device bridges the space between said at least one substrate of the display panel and the circuit board such that the driver IC is located over the space and the output electrode of the semiconductor device is connected to the electrode terminal on said at least one substrate of the display panel with an anisotropic conductive adhesive.

6. A display apparatus according to claim 5, wherein the input electrode of the semiconductor device is connected to the first conductor end of the conductor on the flexible wiring member by a tape-automated bonding method.

7. A display apparatus according to claim 5, wherein the connection between the second electrode of the semiconductor device and the first conductor end of the conductor on the flexible wiring member is sealed with a resin.

* * * * *

UNITED STATES PATENT AND TRADEMARK OFFICE
CERTIFICATE OF CORRECTION

PATENT NO. : 6,738,123 B1
DATED : May 18, 2004
INVENTOR(S) : Masanori Takahashi et al.

It is certified that error appears in the above-identified patent and that said Letters Patent is hereby corrected as shown below:

Column 2,
Line 1, "or" should read -- for --.

Column 6,
Line 51, "area1" should read -- areal --.

Column 7,
Line 66, "canning" should read -- scanning --.

Column 8,
Line 43, "area1" should read -- areal --.

Column 9,
Line 17, "ends of the conductors" should be deleted; and
Line 18, "conductor" should be deleted.

Signed and Sealed this

Sixteenth Day of November, 2004

JON W. DUDAS
*Director of the United States Patent and Trademark Office*